(12) United States Patent
Ichikawa et al.

(10) Patent No.: US 8,303,755 B2
(45) Date of Patent: Nov. 6, 2012

(54) MANUFACTURING METHODS OF PIEZOELECTRIC DEVICES

(75) Inventors: Ryoichi Ichikawa, Saitama (JP); Mitoshi Umeki, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 517 days.

(21) Appl. No.: 12/574,653

(22) Filed: Oct. 6, 2009

(65) Prior Publication Data

US 2010/0084086 A1    Apr. 8, 2010

(30) Foreign Application Priority Data

Oct. 6, 2008    (JP) .................................. 2008-259377

(51) Int. Cl.
 *B32B 37/00* (2006.01)
 *B32B 37/02* (2006.01)
 *B32B 38/00* (2006.01)
 *B32B 38/04* (2006.01)
(52) U.S. Cl. ........ 156/257; 156/250; 156/252; 156/253; 156/256; 156/272.2; 156/281
(58) Field of Classification Search ............ 156/250, 156/252, 253, 256, 257, 272.2, 281
See application file for complete search history.

(56) References Cited

U.S. PATENT DOCUMENTS

| | | | | |
|---|---|---|---|---|
| 5,188,280 A | * | 2/1993 | Nakao et al. | 228/123.1 |
| 6,128,953 A | * | 10/2000 | Mizukoshi | 73/504.02 |
| 7,288,484 B1 | * | 10/2007 | Goto et al. | 438/710 |
| 2007/0037396 A1 | * | 2/2007 | Verhaverbeke | 438/689 |

FOREIGN PATENT DOCUMENTS

JP    2003-158439    5/2003

OTHER PUBLICATIONS

Kawauchi Osamu, Machine Translation of JP-2003158439, Published May 30, 2003.*

* cited by examiner

*Primary Examiner* — Mark A Osele
*Assistant Examiner* — Christopher C Caillouet
(74) *Attorney, Agent, or Firm* — Klarquist Sparkman, LLP

(57) ABSTRACT

Methods are disclosed for manufacturing piezoelectric devices. An exemplary method comprises the step of bonding a lid wafer, a piezoelectric frame wafer (having a vibrating piece and a outer frame surrounding the vibrating piece), and a base wafer (having at least one wiring through-hole) together. A surface of a unit (typically ball-shaped) of eutectic metal is cleaned and then arranged on the through-hole. The unit of eutectic metal is then melted in a vacuum or inert gas environment to allow the eutectic metal to enter the through-hole.

6 Claims, 6 Drawing Sheets

MANUFACTURING METHODS OF PIEZOELECTRIC DEVICES

CROSS-REFERENCE TO RELATED APPLICATION

This application claims priority to and the benefit of Japan Patent Application No. 2008-259377, filed on Oct. 6, 2008, in the Japan Patent Office, the disclosure of which is incorporated herein by reference in its entirety.

1. Field

The present invention relates to a manufacturing method of forming piezoelectric devices using sealing through-holes.

2. Description of the Related Art

Nowadays, crystal vibrating devices used for mobile communication device or Office Automation ("OA") equipment must be increasingly miniaturized, provide a thinner profile, or operate at higher frequencies so as to be correspondingly accommodated in electronic devices that likewise are miniaturized or operate at higher frequencies.

In the conventional art, a piezoelectric vibrator has a piezoelectric vibrating piece contained in a package, and the piezoelectric vibrating piece is connected to an electrode arranged in the package. Generally, the package is made of glass or ceramic, and the package comprises a designated space within the package. On the bottom surface of the package, through-holes which penetrate through the bottom surface are formed. The through-holes are sealed by, for example, eutectic metals. In a reflow step, which seals the through-holes formed on the package by eutectic metal, components of a eutectic metal spread to form an electrode film on the piezoelectric vibrating piece. This spread is also accompanied by migration of gold (Au) in the electrode film, which causes fluctuations in crystal impedance (CI) value and oscillation frequency.

For example, a sealing method for a ceramic package is described in Japan Unexamined Patent Application No. 2003-158439 (the "'439 application"), which describes a method of using an adhesive, such as a brazing filler metal, applied on a top surface of a package. The adhesive is melted in a heatable chamber by loading from the top, and then the package is pressure bonded together. Then, ball-shaped units of gold-germanium (Au/Ge) alloy are arranged on the through-holes and irradiated by laser light (within a vacuum chamber or a chamber filled with inert gas) to seal the package.

In the method disclosed in the '439 application the sealing material is described as being arranged on through-holes formed on the bottom surface of the package. The sealing materials are melted by laser-light irradiation to seal the through-holes. However, this step must be done one-by-one, so mass production is difficult. Also, the ball-shaped units of gold-germanium (Au/Ge) alloy are easily oxidized. Thus, an oxidized film can easily form on the balls. The presence of an oxidized film makes the alloy difficult to flow and makes the sealing process more difficult. Further, segregated regions of germanium (Ge) can be found on the surface of the gold-germanium alloy ball, in which the concentration of germanium (Ge) is high to allow the germanium to flow to the electrodes of the crystal vibrating piece when the balls are melted. The combination of a gold surface and germanium is good for electrical conduction, and allows a flow speed that is faster than that of gold-tin (Au/Sn). Therefore, if germanium flows to an electrode of the crystal vibrating piece, the resistance characteristic of the electrode may undesirably change. This can also cause undesirable fluctuations in vibration frequency. Also, if the germanium flows to an electrode pattern, the film itself may become so thin that it causes disconnection. This effect also causes frequency instability.

The purpose of present invention is to control the spreading of eutectic metal to the electrode film as well as prevent migration of gold (Au) in an electrode film via the through-holes. The invention also provides a method of manufacturing airtight piezoelectric devices.

Further, respective wafers on which package lids, package bases, and crystal vibrating pieces are formed can be handled at the wafer level. During manufacture of piezoelectric devices, the package pieces on the respective wafers are bonded together by siloxane (Si—O—Si) bonding.

SUMMARY

A method of manufacturing a piezoelectric device has a first aspect comprising a step of bonding and sandwiching a piezoelectric frame wafer between a lid wafer and a base wafer having through-hole wiring. The piezoelectric frame wafer includes a vibrating piece and an outer frame surrounding the vibrating piece. The method includes a step of cleaning a surface of a eutectic metal, a step of arranging the eutectic metal on an already-cleaned surface of the through-hole wiring, and a step of melting the eutectic metal in a vacuum or inert-gas atmosphere.

According to this configuration, the oxidized film formed on the surface of the eutectic metal is removed, allowing the eutectic metal to be melted properly when heated. Thus, it does not affect excitation electrodes of the vibrating piece so that the resonant frequency of the vibrating piece will be stable.

A method of manufacturing a piezoelectric device has a second aspect that comprises a bonding step using siloxane bonding to bond together the base wafer, the lid wafer, and the piezoelectric-frame wafer made of a crystal material.

When multiple piezoelectric devices are bonded together in large numbers, bonding thereof by siloxane bonding is preferred.

A method of manufacturing a piezoelectric device has a third aspect that comprises a surface-cleaning step that includes a light-etching step to reduce the concentration of hydrofluoric acid relative to the eutectic metal.

A method of manufacturing a piezoelectric device according to a fourth aspect comprises a surface-cleaning step that further includes a UV light-irradiation step to irradiate the eutectic metal using ultraviolet (UV) light.

By conducting light-etching or UV light irradiation of the eutectic metal, an oxidized film formed on the surface of a film (wherein the oxidized film is a highly concentrated component of the eutectic metal) is removed.

A method of manufacturing a piezoelectric device further comprises an annealing step for annealing the eutectic metal after cleaning the eutectic metal with, e.g., water between the light-etching step and the arranging step.

Gas components may be produced when the eutectic metal is melted, but the remaining gas components on the eutectic metal ball can be removed after performing the annealing step.

A method of manufacturing a piezoelectric device has a sixth aspect comprising a step of dicing the piezoelectric frame wafer, the base wafer, and the lid wafer that have been bonded together.

Because piezoelectric devices in certain embodiments of the disclosed technology have eutectic metal balls that are cleaned, melted eutectic metal spreads evenly in the through-hole wiring, thus enabling manufacture of air-tight piezoelectric devices. Also, spreading of eutectic metal components to the electrode film of a piezoelectric vibrating piece or migration of gold (Au) in the electrode film is prevented. Further, the piezoelectric devices of the disclosed technologies can be bonded at the wafer level so that mass production and cost reduction can be achieved.

DETAILED DESCRIPTION

Figure 1A:
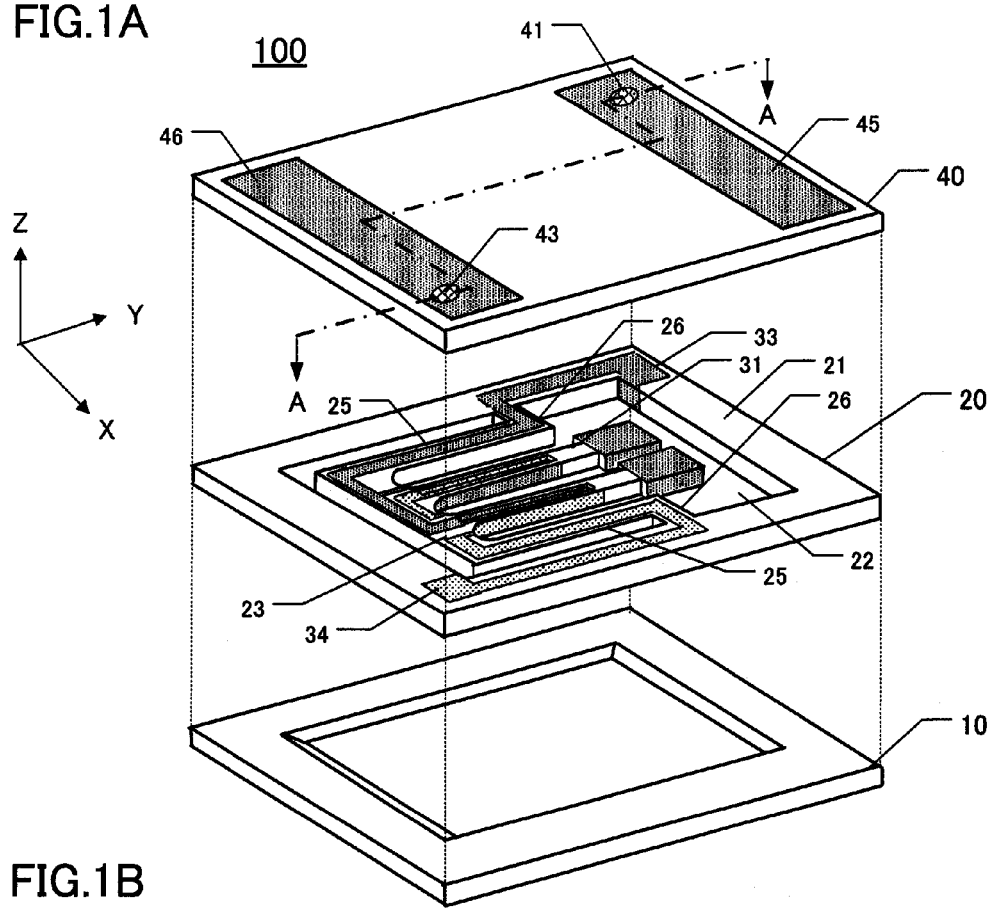
FIG. 1A is a perspective exploded view in which a base 40 of a piezoelectric device 100 is separated.
Figure 1B:
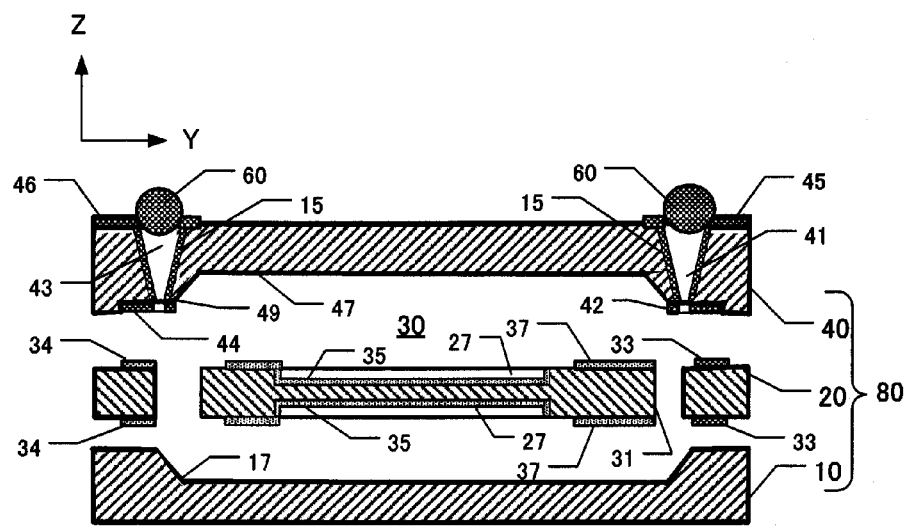
FIG. 1B is a cross-sectional view of a piezoelectric device 100 along the line A-A in FIG. 1A.

FIG. 1A is a perspective exploded of a piezoelectric device 100, in which the base is uppermost, and FIG. 1B is a cross-sectional view of the piezoelectric device 100 along the line A-A in FIG. 1A.

As FIG. 1A shows, the piezoelectric device 100 comprises three layers: a lid 10 made of a crystal "board," a piezoelectric frame 20 having a tuning-fork-type crystal vibrating piece 30, and a base 40 made of a crystal "board."

The piezoelectric frame 20 is comprised of a tuning-fork-type crystal vibrating piece 30 situated in the center. The vibrating piece has a pair of supporting arms 25 and an outer frame 21. These components are formed uniformly with crystal boards having substantially uniform thickness. The tuning-fork-type crystal vibrating piece 30 of the piezoelectric frame 20 includes connection portions 26 by which the outer frame 21 and the supporting arms 15 are connected together. The piezoelectric frame 20 includes a first base electrode 33 and a second base electrode 34 on the outer frame 21 and on the base 23. A void 22 exists between the tuning-fork-type crystal vibrating piece 30 and the outer frame 21. The void 22 defines a profile outline of the tuning-fork-type crystal vibrating piece 30 as formed by crystal etching. The tuning-fork-type crystal vibrating piece 30 includes a base 23 and a pair of vibrating arms 31 that extend from the base 23. The vibrating arms 31 have grooves 27, excitation electrodes 35, and weights 37 at their distal end.

As shown in FIG. 1B, the lid 10 comprises a concavity 17 facing one surface of the piezoelectric frame 20. The base 40 comprises a concavity 47 that faces the other surface of the piezoelectric frame 20. The base 40 has a first through-hole 41, a second through-hole 42, and a step 49. At the step 49, the first connecting electrode 42 and a second connecting electrode 44 are connected to the first through-hole 41 and the second through-hole 43. A first external electrode 45 and a second external electrode 46 are formed on the bottom surface of base 40.

On the inner surfaces of the first and second through-holes 41, 42 of the base 40 is a metal film 15. The metal film 15 is formed concurrently with the first and second connecting electrodes 42, 44 and the first and second external electrodes 45, 46 by a photolithography method. The metal film 15 comprises two layers: a gold (Au) layer formed on a nickel (Ni) layer. The nickel layer is 150 to 700 Ångstroms thick and the gold layer is 400 to 1000 Ångstroms thick. Instead of the nickel layer, a chrome (Cr) or titanium (Ti) layer can be used.

The first connecting electrode 42 is electrically connected to the first external electrode 45 formed at the bottom of the base 40 via the first through-hole 41. The second connecting electrode 44 is electrically connected to the second external electrode 46 formed at the bottom of the base 40 via the second through-hole 43.

The base 40 is bonded to a "top" surface of the piezoelectric frame 20 comprising a tuning-fork-type crystal vibrating piece 30, and the lid is bonded to a "bottom" surface of the piezoelectric frame 20 to form the piezoelectric device 100 with the crystal vibrating piece located in the center of the sandwich. Thus, the first base electrode 33 is connected to the first connecting electrode 42, and the second base electrode 34 is connected to the second connecting electrode 44, respectively. The base 40 is bonded to the piezoelectric frame 20 and the lid 10 is bonded to the piezoelectric frame 20, respectively, by siloxane bonding.

After bonding the package 80 together by siloxane bonding, eutectic metal balls 60 are washed by light-etching and treated by deaeration. The eutectic metal balls 60 are arranged on the first through-holes 41 and second through-holes 43 as the holes face upwards. Then, the package 80 on which the eutectic metal balls 60 are arranged is heated for a designated time within a reflow furnace, filled with an inert gas atmosphere or vacuum, in which the eutectic metal balls 60 are melted. As an eutectic metal ball 60 is melted, it retains its ball shape due to surface tension within the melt. The ball is then flattened using a tool (not shown). Once the eutectic metal balls 60 are flattened, the eutectic metal flows along the metal film 15 to seal the first and second through-holes 41, 43.

Figure 2:
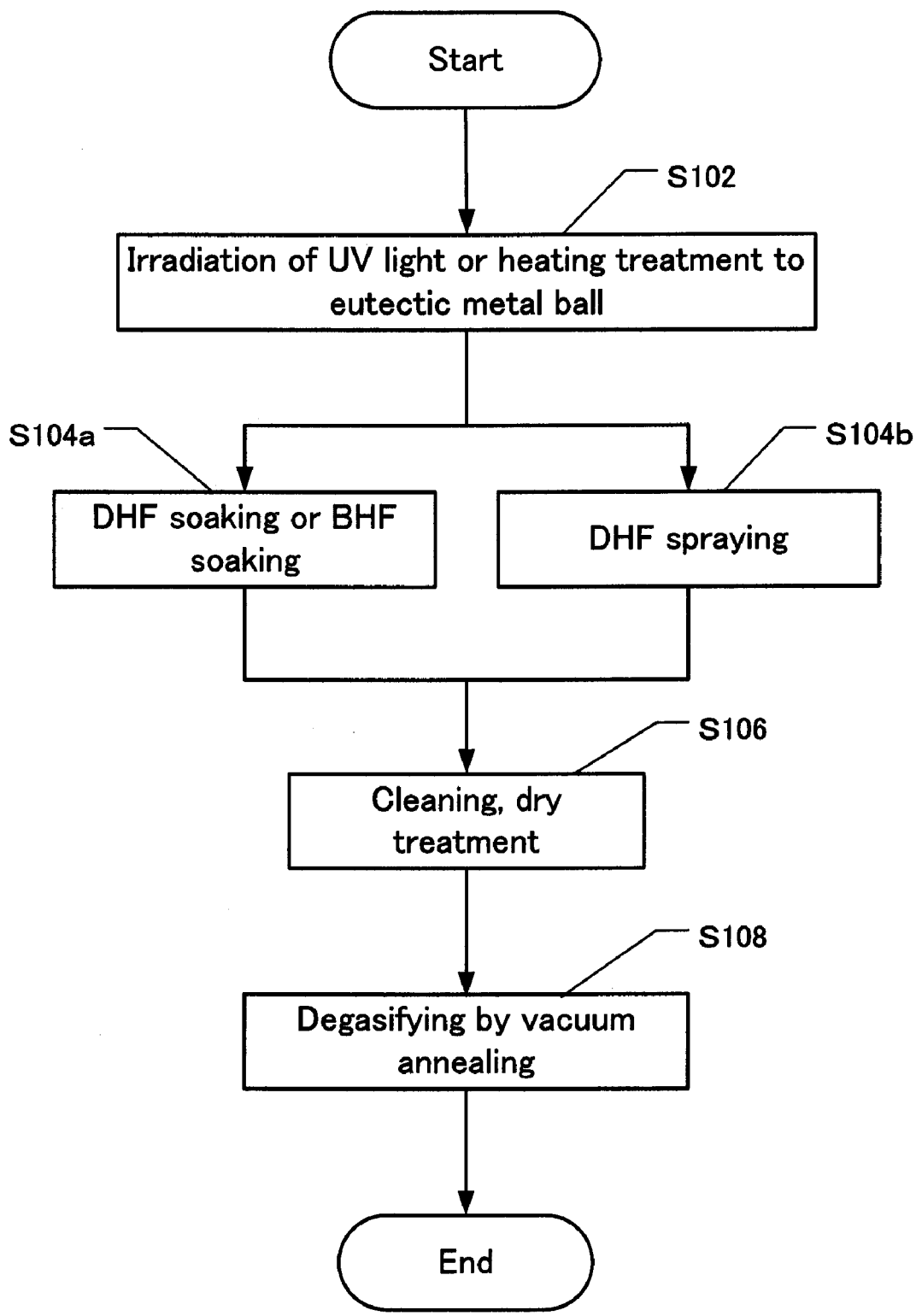
FIG. 2 is a flow chart for performing light-etching of a eutectic metal ball 60 by wet-etching.
Figure 3:
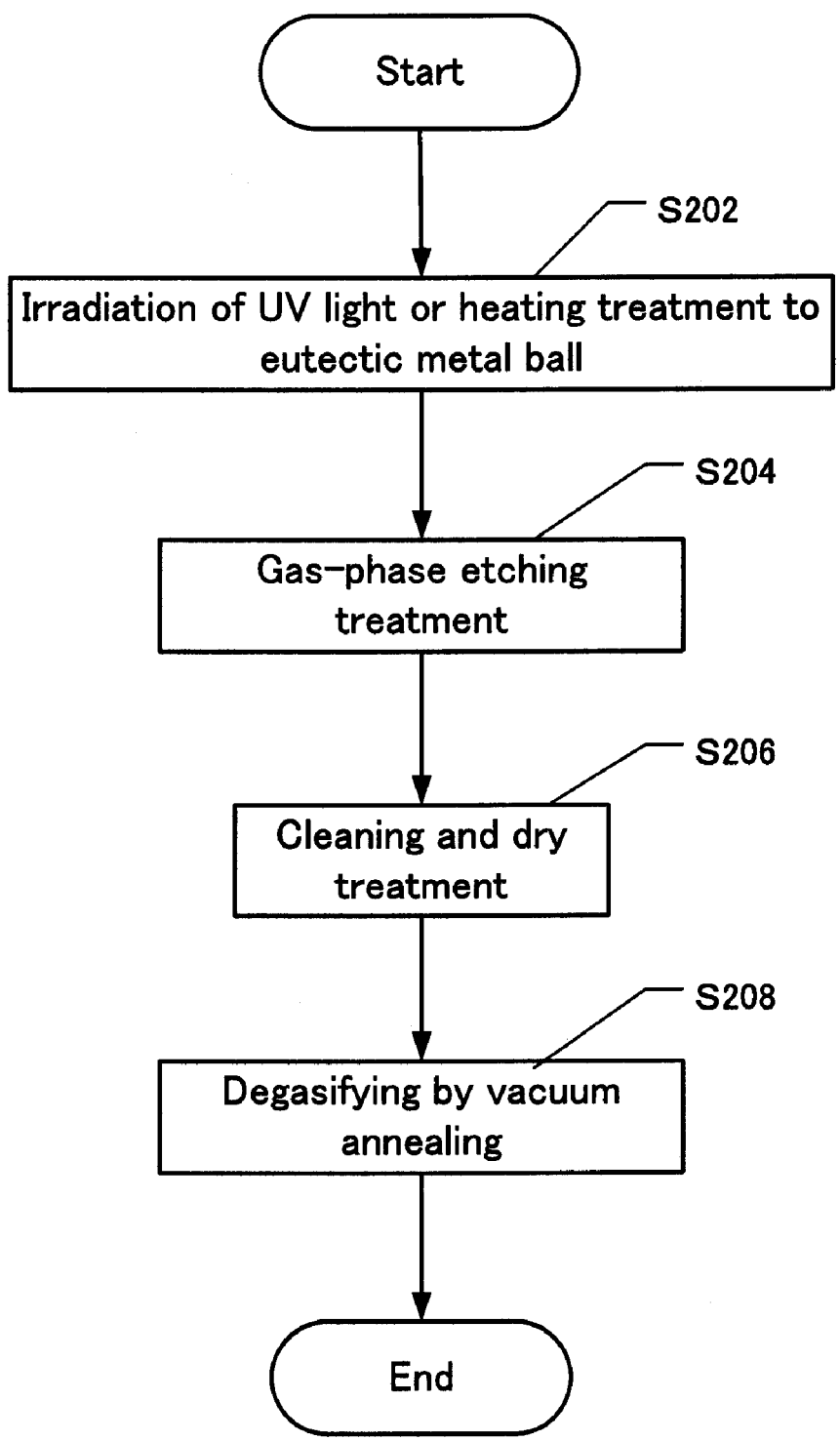
FIG. 3 is a flow chart for performing light-etching of a eutectic metal ball 60 by wet-etching.
Figure 4:
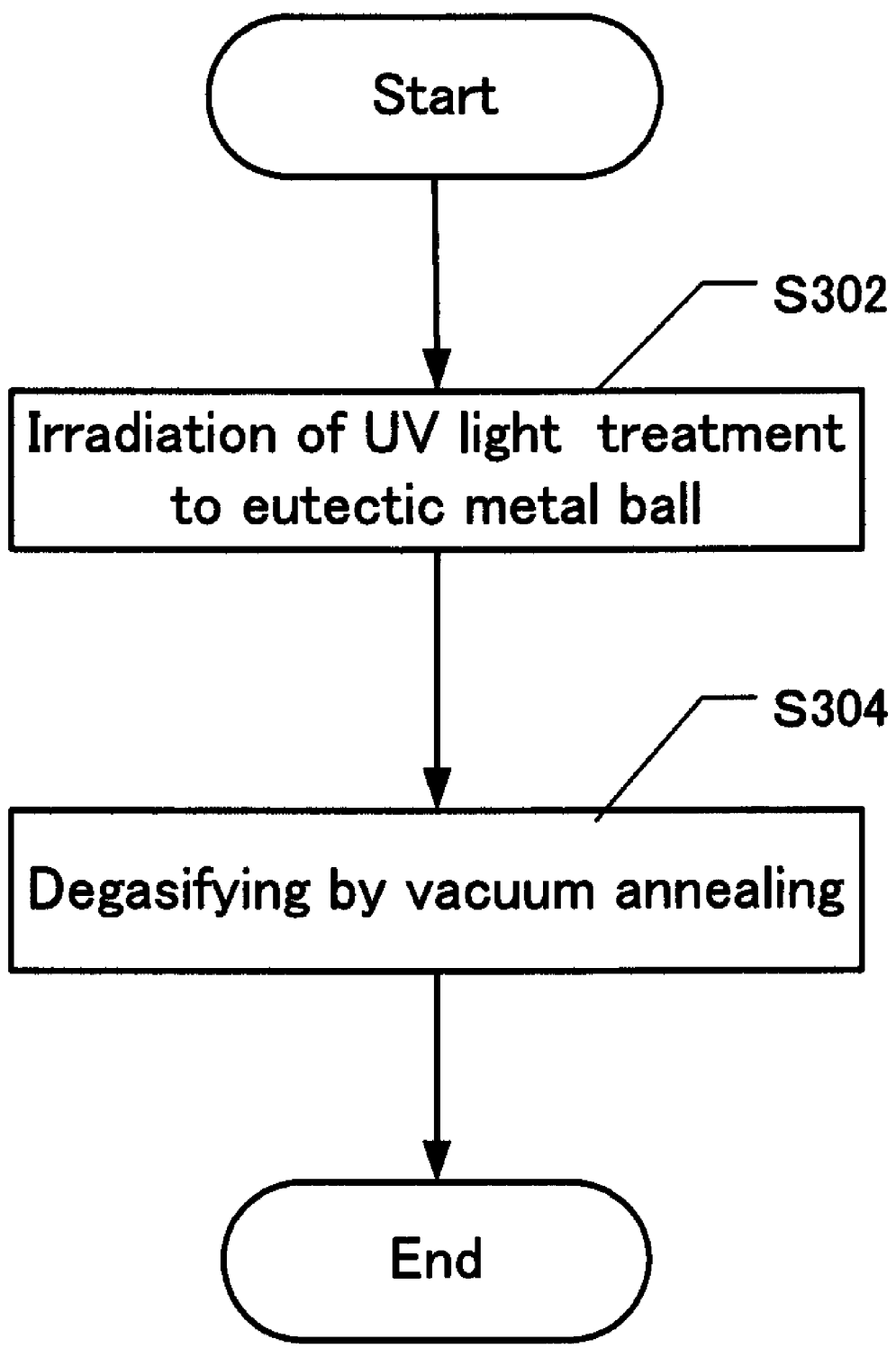
FIG. 4 is a flow chart for performing light-etching of a eutectic metal ball 60 by UV irradiation.

For a given eutectic metal ball 60, gold-germanium ($Au_{12}Ge$) alloy to which a light-etching process explained in FIGS. 2 to 4 is applied. The eutectic metal balls 60 are cleaned by light-etching and treated by deaeration to remove oxidized film from their surfaces and also to control the amount and behavior of germanium (Ge), which is highly concentrated on the surfaces of the balls. Thus, the phenomenon that otherwise would spread germanium to the first and second connecting electrodes 42, 44 can be controlled. Also, the phenomenon exhibited by eutectic metal, in which gold (Au) tends to migrate on the first and second connecting electrodes 42, 44, is controlled. In this way, electrodes, such as the first and second connecting electrodes 42, 44, are made stable so that a piezoelectric device having a more stable vibration frequency can be manufactured.

Surface Treatment of Eutectic Metal Ball

FIGS. 2 to 4 show flow charts for surface treatment of a eutectic metal ball 60. FIG. 2 is a flow chart for a light-etching process for a eutectic metal ball 60 by wet-etching.

In step S102, in order to remove contaminants, such as organic substances and moisture on the surface of eutectic metal ball 60, UV light irradiation or heat treatment is performed. UV light irradiation is performed using UV light having a wavelength of 165 nm and 254 nm to irradiate the ball. A cover is used for preventing leakage of UV light. The heat treatment is conducted using a hot plate or infrared light lamp to heat the eutectic metal ball 60 to 150° C. to 200° C. to degrade organic substances and remove them from the ball.

In step S104a, DHF (Dilute Hydrogen Fluoride) cleaning or BHF (Buffered Hydrogen Fluoride: $NH_4F$, HF, $H_2O$) cleaning (both of which are light-etching treatments) is performed. During DHF cleaning after irradiation of UV light or heating treatment, the eutectic metal ball 60 is placed in a netting container. Then the ball is soaked in hydrofluoric acid solution, having a concentration of 0.5 Wt %, for thirty seconds. The eutectic metal ball 60 is etched by about 5 nm. With this treatment, the oxidized surface of the ball 60 and highly concentrated germanium on the surface of the ball can be controlled when the ball is melted.

During a BHF cleaning, the eutectic metal ball 60 after irradiation of UV light or heating treatment is soaked in 200:1 BHF for thirty seconds, and a similar effect as obtained with the DHF cleaning is achieved. 200:1 BHF is a liquid containing 0.25 Wt % hydrofluoric acid (HF) and 39.8 Wt % ammonium fluoride ($NH_4F$).

In step S104b, DHF spraying of the balls is performed to achieve DHF cleaning (a light-etching treatment) of the balls. During DHF spraying, hydrofluoric acid at a concentration of 0.5 Wt % is sprayed onto the eutectic metal balls 60 after the balls have had UV light irradiation or heat treatment. A similar effect as obtained from DHF cleaning is achieved. Note that either step S104a or step S104b, not necessarily both, can be conducted as a light-etching treatment.

In step S106, a eutectic metal ball 60 after being treated by light-etching is kept in the netting container and placed in a rotary drive device to remove diluting solution by rotation. Next, cleaning fluid is applied to remove the diluting solution, and then the balls are washed by purified water. The eutectic metal balls 60 are dried by infrared light irradiation or by heated air. With these steps, any organic substances on the surface of eutectic metal ball 60 are degraded and removed. Also removed are the oxidized surface and highly concentrated germanium.

In step S108, a eutectic metal ball 60 after completion of light-etching treatment is placed in a vacuum heating furnace heated to a designated temperature to conduct vacuum annealing by maintaining the ball at temperature and in a vacuum state for approximately ten minutes. Remaining gas components on the eutectic metal ball 60 are removed by the annealing treatment. Note that the designated temperature of the vacuum heating furnace should be set slightly lower or equal to the melting temperature of the eutectic metal ball 60.

FIG. 3 is a flow chart for light-etching a eutectic metal ball 60 by wet-etching.

In step S202, to remove contaminants (particles) such as organic substances and moisture on the surface of eutectic metal ball 60, UV light irradiation or heat treatment is performed. During UV light irradiation, for example, UV light having wavelengths of 185 nm and 254 nm is irradiated onto the eutectic metal ball 60. The heat treatment is conducted using a hot plate or infrared-light lamp to heat the eutectic metal ball 60 up to 150° C. to 200° C. to degrade organic substances and remove them from the balls.

With this heating treatment, adherence of particles on the surface of the eutectic metal balls 60 becomes weak so that the particles can be removed properly and efficiently by, e.g., spraying hot air from an air nozzle onto the surfaces of the balls.

In step 5204, light-etching treatment by gas-phase etching using hydrofluoric acid vapor is performed. A preferable temperature for the treatment of gas-phase etching is 40° C. to 80° C., allowing the eutectic metal balls 60 to be retained near the optimum temperature. The hydrofluoric acid solution used for gas-phase etching is controlled at a concentration (1 atmosphere, 39.6 Wt % concentration at room temperature). With such a composition, pseudo-hydrofluoric acid is formed at a rate equal to the evaporation rate of hydrogen and hydrogen fluoride. Nitrogen gas is infused as a carrier gas to a hydrofluoric acid vapor-generating container filled with a hydrofluoric acid solution providing the desired concentration of pseudo-hydrofluoric acid composition. Then, a light-etching treatment is performed on the balls by providing the vapor on the surface of a eutectic metal ball 60.

In step 5206, a eutectic metal ball 60 is washed by purified water and then dried by irradiation of infrared light or by application of heated air to the balls.

In step 5208, a eutectic metal ball 60, after completion of a light-etching treatment, is placed in a vacuum-heating furnace at 320° C. for 10 minutes in a vacuum state, thereby performing a vacuum-annealing treatment. With the vacuum-annealing treatment, remaining gas components on the eutectic metal ball 60 are removed.

FIG. 4 is a flow chart for light-etching a eutectic metal ball 60 by UV irradiation.

In step S302, the surface of a eutectic metal ball 60 is light-etched by irradiating with UV light having wavelengths of 185 nm and 254 nm in a vacuum state in a vacuum heating furnace. By this light-etching by irradiation of UV light, the organic substances on the surface of the eutectic metal ball 60 are degraded and removed. Also, the oxidized surface and highly concentrated germanium on the surface of the ball are removed.

Next, in step 5304, after completion of light-etching, the eutectic metal ball 60 is placed in a vacuum-heating furnace at 320° C. for 10 minutes, while maintaining a vacuum state to conduct a vacuum-annealing treatment. With the vacuum-annealing treatment, the remaining gas components on the eutectic metal ball 60 are removed.

Figure 5A:
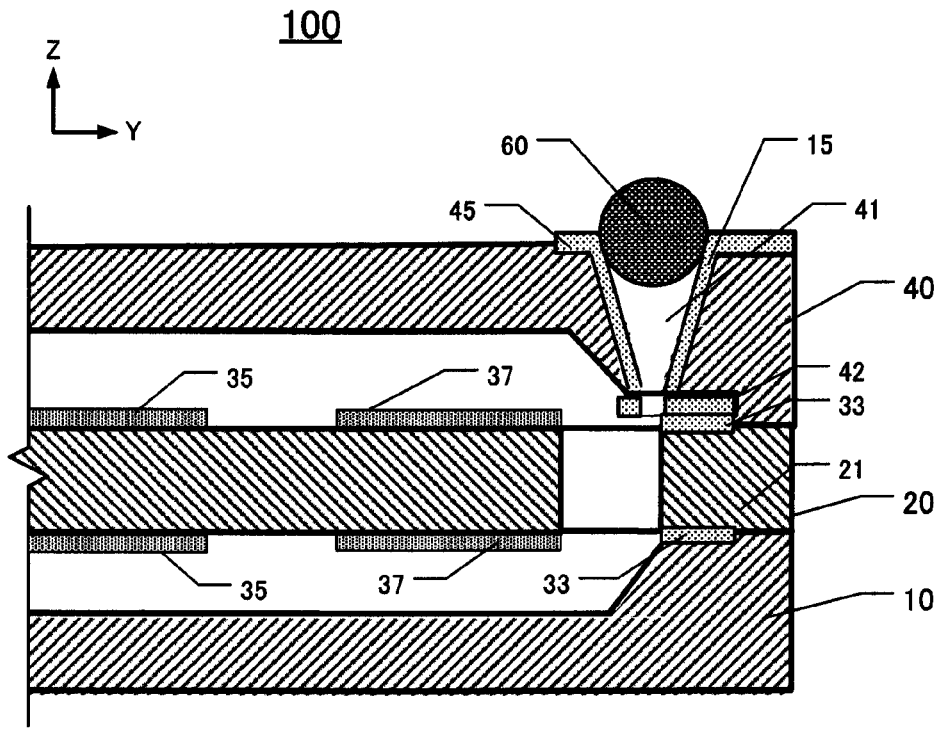
FIG. 5A is an enlarged view around a first through-hole 41 before a eutectic metal ball 60 is melted.
Figure 5B:
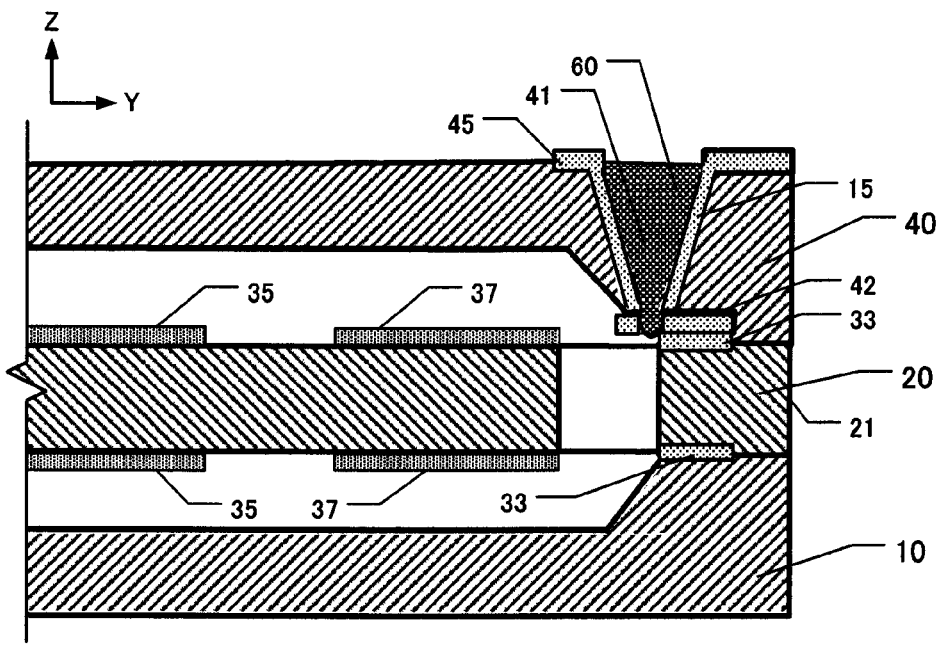
FIG. 5B is an enlarged view around a first through-hole 41 after a eutectic metal ball 60 has been melted and the through-hole has been sealed.

FIG. 5A is an enlarged view of the vicinity of a first through-hole 41 before the eutectic metal ball 60 is melted, and FIG. 5B is an enlarged view of the vicinity of a first through-hole 41 after the eutectic metal ball 60 is melted and the through-hole is sealed. The second through-hole 43 is the same.

As shown in FIG. 5A, the lid 10, the first piezoelectric frame 20, and the first base 40, bonded by siloxane bonding, are arranged upside-down. Then, a eutectic metal ball 60 which has been light-etched, is placed on the first through-hole 41. The ball starts to melt at about 350° C. in the vacuum-reflow furnace, so the ball can be flattened using a tool. The time to achieve melting of the eutectic metal ball 60 that has been treated by light-etching, is unchanged so this process can be done at the wafer level.

Then, as FIG. 5B shows, the melted eutectic metal ball 60 spreads in the first through-hole 41 and seals the hole. When the eutectic metal ball 60 is melted in this way, germanium (Ge) in the ball 60 does not spread rapidly to the first and second base electrodes 33, 34. Because the ball 60 is etched to a depth of 5 nm by the light-etching step, the oxidized film on its surface and highly concentrated germanium (Ge) are removed. Thus, spread of metal to the electrodes and migration of gold are limited. Thus, the characteristic vibration frequency of the tuning-fork-type crystal vibrating piece 30 is stabilized before and after the reflow step.

Manufacturing Piezoelectric Devices

Figure 6:
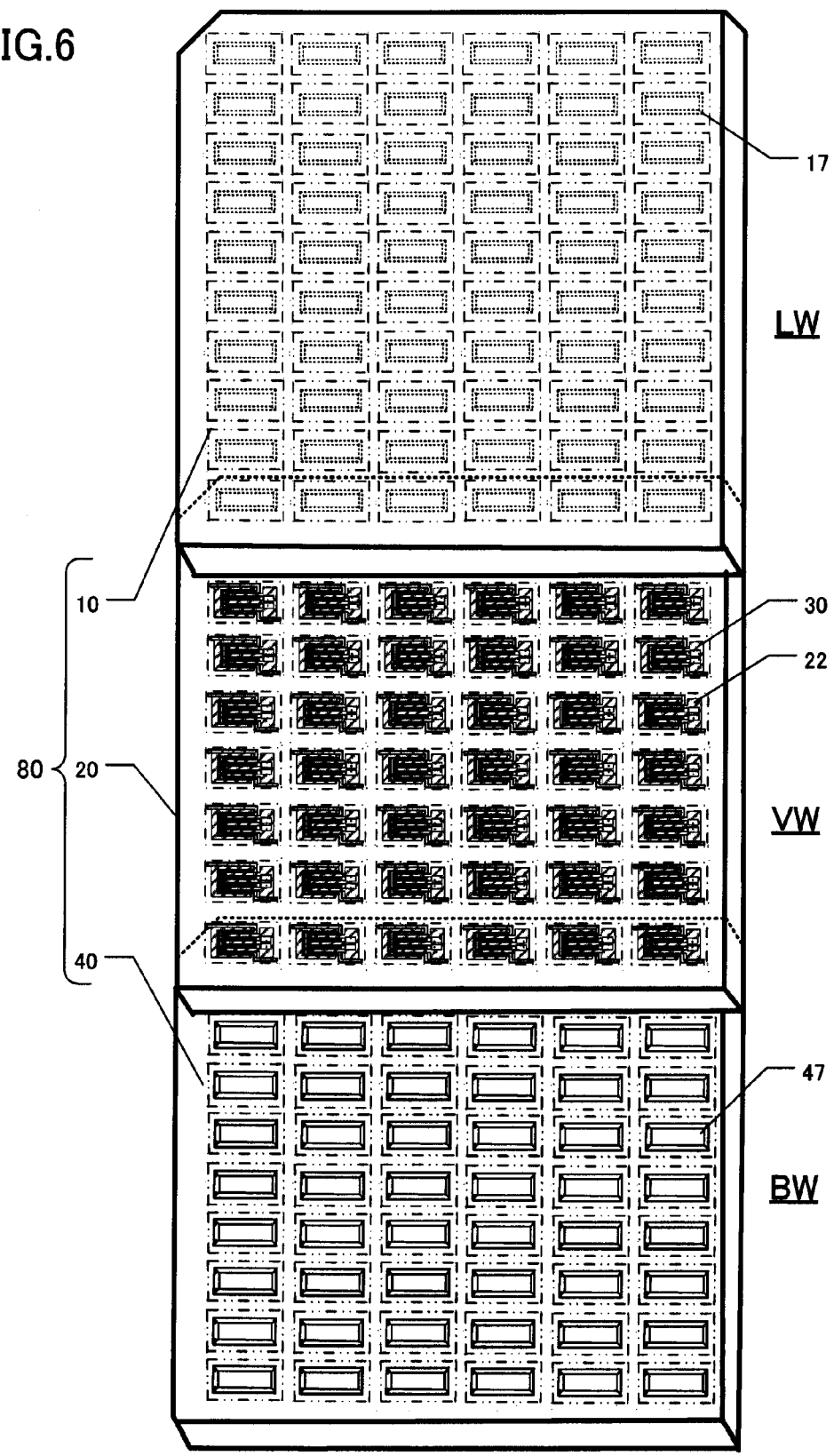
FIG. 6 is a perspective view before a lid wafer LW, a frame wafer VW, and a base wafer BW are layered together.

FIG. 6 is a perspective view before a lid wafer LW, a frame wafer VW, and a base wafer BW are layered. The lid wafer LW includes a plurality of lids 10. The frame wafer VW includes a plurality of tuning-fork-type crystal vibrating pieces 30 and respective piezoelectric frames 20. The base wafer BW includes a plurality of bases 40. For purpose of explanation, the lids 10 are illustrated with virtual lines as are the piezoelectric frames 20 on the frame wafer VW and bases 40 on the base wafer BW. Note that, while 42 pieces of the lid 10, the piezoelectric frame 20 and the base 40 are respectively illustrated on each crystal wafer depicted in FIG. 6, hundreds or thousands of piezoelectric devices 100 can be formed on the bonded crystal wafers.

Before the crystal wafers are layered, the concavity 17 of the lid 10 is formed by etching. Also formed are the concavity 47 of the base 40 and the first and second connecting electrodes 42, 44 (not shown). On the tuning-fork-type crystal vibrating piece 30 are formed the first and second base electrodes 33, 34 and excitation electrode 35. For bonding, the contacting surfaces of the lid 10 and base 40 with the frame 20 are activated by rendering them as mirror surfaces and then treating them with plasma or an irradiating ion beam.

For example, the size of each activated crystal wafer (containing multiple devices) has a diameter of 4 inches. The wafers include respective orientation flats by which the wafers are aligned and layered correctly. The three sandwiched crystal wafers are bonded strongly together by siloxane bonding to form packages 80. After forming a package 80, sealing of the first and second through-holes 41, 43 (FIG. 1) is performed in a vacuum state or inactive atmosphere. For sealing of through-holes, eutectic metal balls 60 treated with light-etching are used.

The lid wafer LW, the base wafer BW, and the frame wafer containing piezoelectric frames 20 are bonded together as one 3-wafer sandwich. Then the sandwich in which the first and second through-holes 41 and 43 have been sealed is cut by a dicing saw or laser saw to complete formation of the piezoelectric devices 100. Packaging and sealing of through-holes are conducted on the sandwich before cutting so that mass manufacturing can be achieved.

Multiple embodiments are described above. But, it will be understood by persons of ordinary skill in the relevant art that any of said embodiments, as well as any other embodiments within the scope of the invention, can be modified or changed. For example, cleaning by water in the light-etching process or a drying step can be omitted. Further, a base or lid not having concavities can be used, which allows the thickness of tuning-fork-type piezoelectric vibrating piece 30 to be thinner than the outer frame.

In the described embodiments, the eutectic metal balls 60 are made of, for example, $Au_{12}Ge$ alloy. Alternatively, gold-tin ($Au_{20}Sn$) alloy (melting temp. 280° C.) or gold-silicon ($Au_{3.15}Si$) alloy (melting temp. 363° C.) can be used.

What is claimed is:

1. A method for manufacturing a piezoelectric device, comprising:
    sandwiching a piezoelectric frame wafer between a lid wafer and a base wafer having at least one wiring through-hole, wherein the piezoelectric frame wafer comprises a vibrating piece and an outer frame surrounding the vibrating piece;
    bonding the frame wafer, lid wafer, and base wafer together as a sandwich;
    cleaning a surface of a unit of eutectic metal by applying to the eutectic metal a concentration of hydrofluoric acid in water, and subsequently washing the eutectic metal in water;
    after cleaning, annealing the eutectic metal at a temperature that is slightly lower than or equal to the melting temperature of the eutectic metal;
    after annealing, arranging the unit of eutectic metal on the wiring through-hole; and
    melting the unit of eutectic metal in a vacuum state or inert-gas atmosphere to cause eutectic metal of the unit to enter the through-hole.

2. The method of manufacturing a piezoelectric device of claim 1, wherein:
    the base wafer, lid wafer, and frame wafer each comprise a crystal material; and
    in the bonding step the base wafer, the lid wafer, and the frame wafer are bonded together by siloxane bonding.

3. The method of manufacturing a piezoelectric device of claim 1, further comprising dicing the sandwich in which the frame wafer, the base wafer, and the lid wafer have been bonded together.

4. A method for manufacturing a piezoelectric device, comprising:
    sandwiching a piezoelectric frame wafer between a lid wafer and a base wafer having at least one wiring through-hole, wherein the piezoelectric frame wafer comprises a vibrating piece and an outer frame surrounding the vibrating piece;
    bonding the frame wafer, lid wafer, and base wafer together as a sandwich;
    cleaning a surface of a unit of eutectic metal by irradiating UV light onto the eutectic metal and washing the eutectic metal using water;
    after cleaning, annealing the eutectic metal at a temperature slightly lower than or equal to the melting temperature of the eutectic metal;
    after annealing, arranging the unit of eutectic metal, having the cleaned surface, on a wiring through-hole; and
    melting the unit of eutectic metal in a vacuum or inert-gas atmosphere to cause eutectic metal of the unit to enter the through-hole.

5. The method of claim 4, wherein:
    the base wafer, lid wafer, and frame wafer each comprise a crystal material; and
    in the bonding step the base wafer, lid wafer, and frame wafer are bonded together by siloxane bonding.

6. The method of claim 4, further comprising dicing the sandwich in which the frame wafer, lid wafer, and base wafer have been bonded together.

* * * * *

UNITED STATES PATENT AND TRADEMARK OFFICE
CERTIFICATE OF CORRECTION

Page 1 of 1

PATENT NO.         : 8,303,755 B2
APPLICATION NO.    : 12/574653
DATED              : November 6, 2012
INVENTOR(S)        : Ichikawa et al.

It is certified that error appears in the above-identified patent and that said Letters Patent is hereby corrected as shown below:

In the Specification:

Column 5, line 58, "5204" should read --S204--

Column 6, line 6, "5206" should read --S206--

Column 6, line 9, "5208" should read --S208--

Column 6, line 25, "5304" should read --S304--

Signed and Sealed this
Twenty-seventh Day of May, 2014

Michelle K. Lee
*Deputy Director of the United States Patent and Trademark Office*